United States Patent
Chen et al.

(10) Patent No.: US 9,215,818 B2
(45) Date of Patent: Dec. 15, 2015

(54) ELECTRONIC DEVICE AND HINGE STRUCTURE THEREOF

(71) Applicant: WISTRON CORP., New Taipei (TW)

(72) Inventors: Hung-Chih Chen, New Taipei (TW);
Chen-Yi Liang, New Taipei (TW);
Chun-Chien Chen, New Taipei (TW)

(73) Assignee: Wistron Corp., New Taipei (TW)

( * ) Notice: Subject to any disclaimer, the term of this patent is extended or adjusted under 35 U.S.C. 154(b) by 307 days.

(21) Appl. No.: 13/935,539

(22) Filed: Jul. 4, 2013

(65) Prior Publication Data

US 2014/0043737 A1 Feb. 13, 2014

(30) Foreign Application Priority Data

Aug. 10, 2012 (TW) ................. 101128903 A

(51) Int. Cl.
*G06F 1/16* (2006.01)
*H05K 5/02* (2006.01)

(52) U.S. Cl.
CPC .............. *H05K 5/0226* (2013.01); *G06F 1/162* (2013.01); *G06F 1/1681* (2013.01); *Y10T 16/547* (2015.01)

(58) Field of Classification Search
CPC ..................................... G06F 1/1681
USPC ..................................... 361/679.26
See application file for complete search history.

(56) References Cited

U.S. PATENT DOCUMENTS

| | | | |
|---|---|---|---|
| 7,917,993 B2* | 4/2011 | Park | 16/239 |
| 8,108,970 B2* | 2/2012 | Huang | 16/337 |
| 8,967,569 B2* | 3/2015 | Hsu | 248/284.1 |
| 2011/0304983 A1* | 12/2011 | Senatori | 361/679.55 |
| 2011/0310548 A1* | 12/2011 | Ahn et al. | 361/679.21 |
| 2012/0188703 A1* | 7/2012 | Yang et al. | 361/679.27 |
| 2013/0265699 A1* | 10/2013 | Zhou | 361/679.01 |

FOREIGN PATENT DOCUMENTS

| | | |
|---|---|---|
| CN | 101498338 A | 8/2009 |
| CN | 101694229 A | 4/2010 |

OTHER PUBLICATIONS

China Patent Office, Office Action, Patent Application Serial No. 201210296975.4, May 26, 2015, China.

* cited by examiner

*Primary Examiner* — Anthony Q Edwards

(57) ABSTRACT

A hinge structure is provided. The hinge structure includes a fixing base, a pivot unit and a supporting element. The pivot unit includes a shaft, wherein the shaft passes through the fixing base, and the shaft is moved in a predetermined direction between a first shaft position and a second shaft position relative to the fixing base, and the predetermined direction is perpendicular to an extending direction of the shaft. The supporting element includes a first connection portion and a second connection portion, wherein the first connection portion and the second connection portion are respectively located at two ends of the supporting element, and the second connection portion pivots on the shaft.

20 Claims, 11 Drawing Sheets

ELECTRONIC DEVICE AND HINGE STRUCTURE THEREOF

CROSS REFERENCE TO RELATED APPLICATIONS

This Application claims priority of Taiwan Patent Application No. 101128903, filed on Aug. 10, 2012, the entirety of which is incorporated by reference herein.

BACKGROUND OF THE INVENTION

1. Field of the Invention

The present invention relates to a hinge structure, and in particular, relates to a hinge structure utilized in an electronic device.

2. Description of the Related Art

FIGS. 1A and 1B show a hinge structure 30 utilized in a conventional portable electronic device 1. A display module 20 of the portable electronic device 1 pivots on a device body 10 of the portable electronic device 1 via the hinge structure 30. Conventionally, the position of the hinge structure 30 is fixed. Therefore, when the display module 20 is pivoted via the hinge structure 30 to cover the device body 10 (FIG. 1B), the display module 20 may interfere with the device body 10, and cannot cover the device body 10 precisely.

BRIEF SUMMARY OF THE INVENTION

In one embodiment of the invention, a hinge structure is provided. The hinge structure includes a fixing base, a pivot unit and a supporting element. The pivot unit includes a shaft, wherein the shaft passes through the fixing base, and the shaft is moved in a predetermined direction between a first shaft position and a second shaft position relative to the fixing base, and the predetermined direction is perpendicular to an extending direction of the shaft. The supporting element includes a first connection portion and a second connection portion, wherein the first connection portion and the second connection portion are respectively located at two ends of the supporting element, and the second connection portion is connected to the shaft, and the shaft passes through the fixing base.

In another embodiment of the invention, an electronic device is provided. The electronic device includes a first part, a second part, a fixing base, a pivot unit and a supporting element. The first part includes a first surface, a second surface and an interface unit, wherein the first surface is opposite to the second surface, and the interface unit is disposed on the first surface. The fixing base is disposed on the second part. The pivot unit includes a shaft, wherein the shaft passes through the fixing base, and the shaft is moved in a predetermined direction between a first shaft position and a second shaft position relative to the fixing base, and the predetermined direction is perpendicular to an extending direction of the shaft. The supporting element includes a first connection portion and a second connection portion, wherein the first connection portion is connected to the first part, the second connection portion is connected to the shaft, and the shaft passes through the fixing base.

Utilizing the hinge structure of the embodiment of the invention, the shaft can be moved upwardly and downwardly. When the electronic device is in the closed state, the first surface of the first part can tightly overlap the second part. The gap between the first surface of the first part and the second part is reduced, and the total thickness of the electronic device is therefore decreased.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
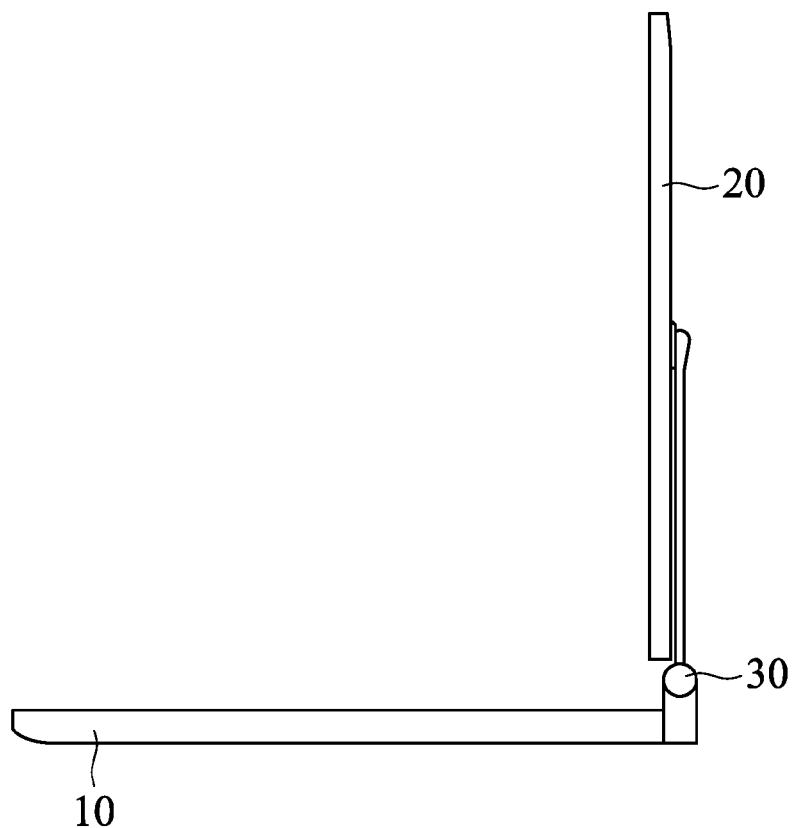
FIG. 1A shows the conventional portable electronic device.
Figure 1B:
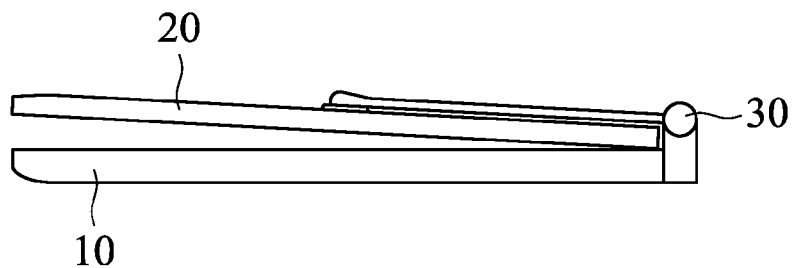
FIG. 1B shows the display module of the conventional portable electronic device covering the device body thereof.
Figure 2A:
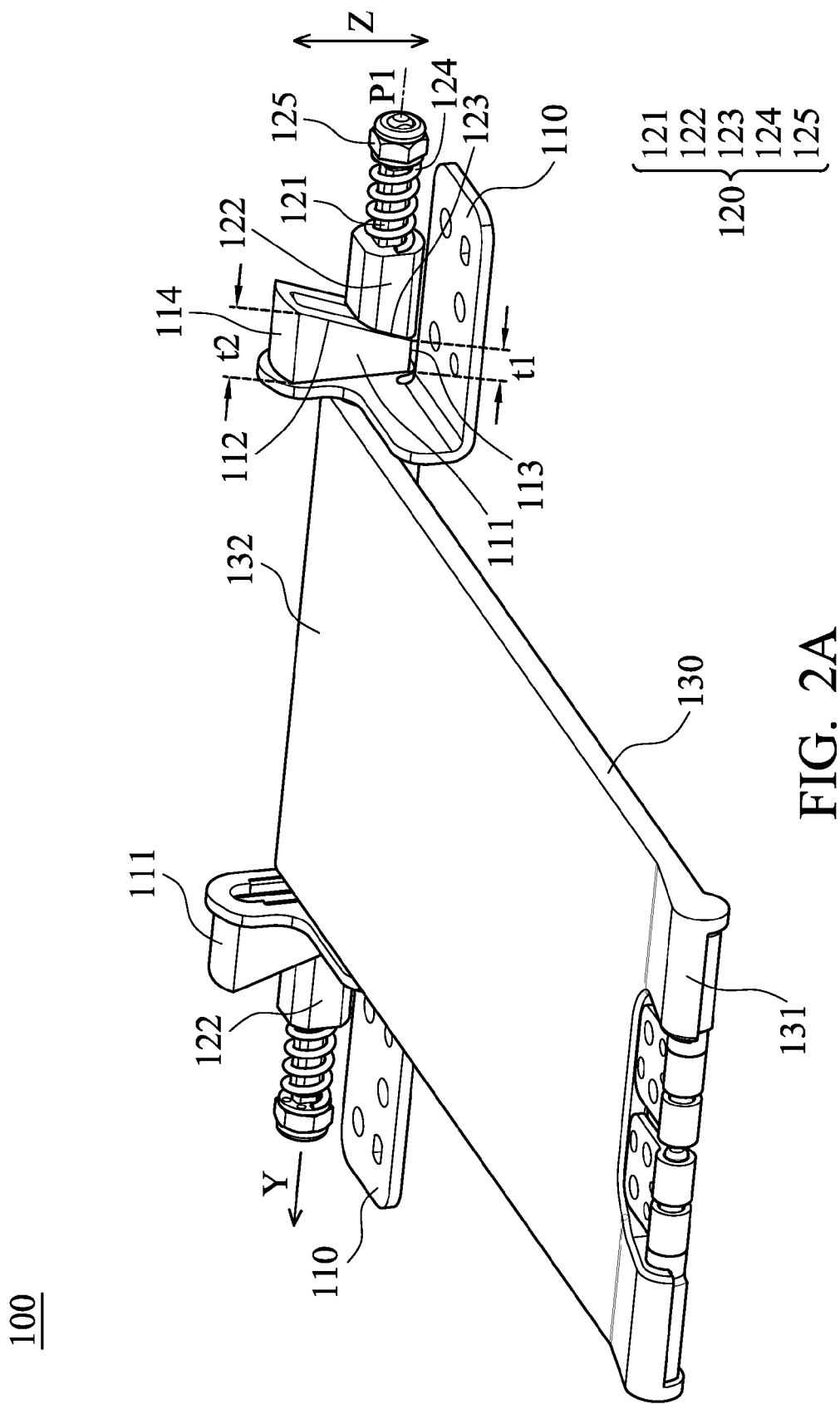
FIG. 2A shows the hinge structure of the embodiment of the invention, wherein the shaft is in the first shaft position.
Figure 2B:
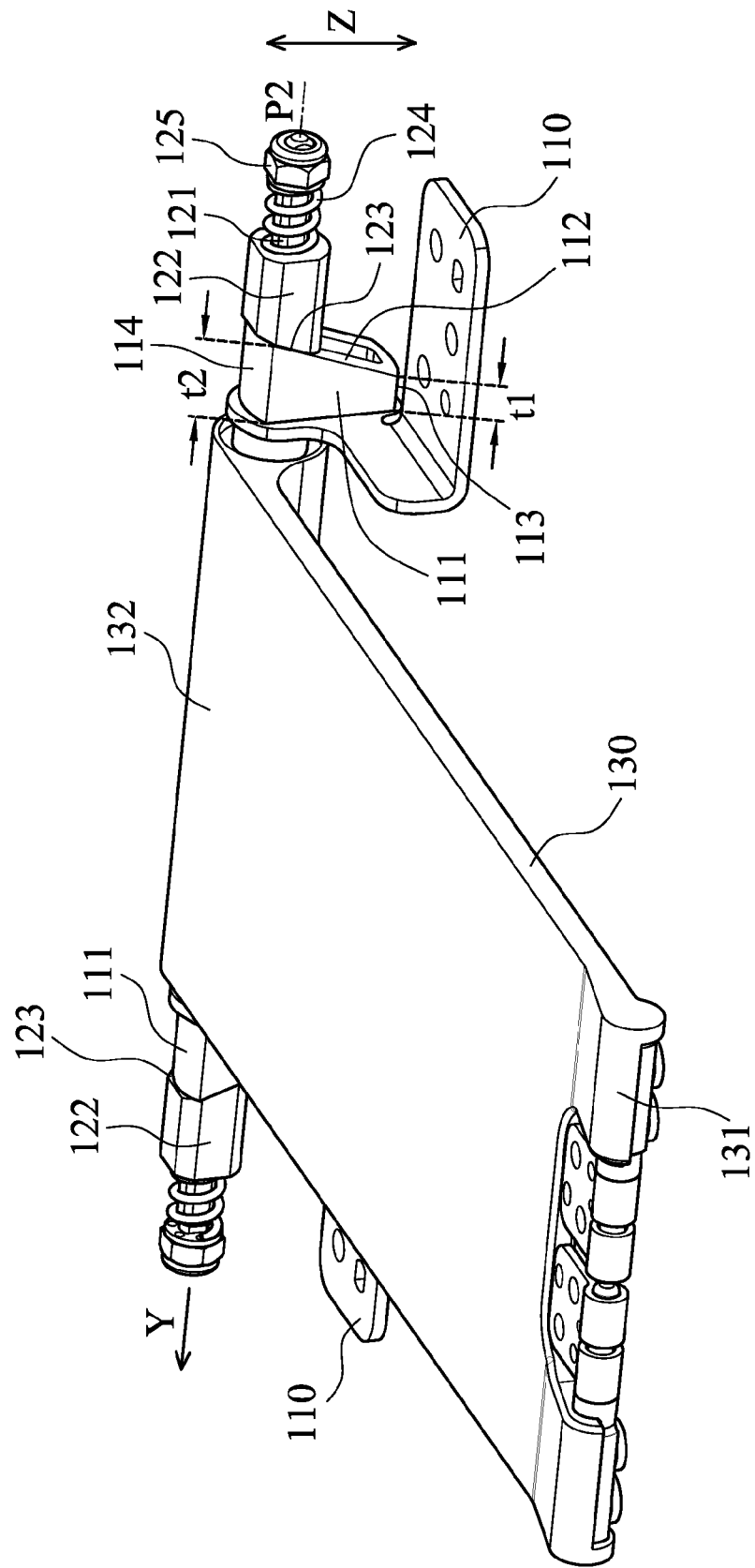
FIG. 2B shows the hinge structure of the embodiment of the invention, wherein the shaft is in the second shaft position.

FIGS. 2A and 2B show a hinge structure 100 of an embodiment of the invention. The hinge structure 100 includes a fixing base 110, a pivot unit 120 and a supporting element 130. The pivot unit 120 includes a shaft 121. The shaft 121 passes through the fixing base 110, and the shaft 121 is moved in a predetermined direction Z between a first shaft position P1 (FIG. 2A) and a second shaft position P2 (FIG. 2B) relative to the fixing base 110. The predetermined direction Z is perpendicular to an extending direction Y of the shaft 121. The supporting element 130 includes a first connection portion 131 and a second connection portion 132. The first connection portion 131 and the second connection portion 132 are respectively located at two ends of the supporting element 130. The second connection portion 132 is connected to the shaft 121, and the shaft 121 passes through the fixing base 110.

The fixing base 110 includes at least one slot member 111. The pivot unit 120 includes at least one slider block 122, and the slider block 122 is disposed on the shaft 121, the slot member 111 is fixed to the fixing base 110, the shaft 121 passes through the slot member 111, the slot member 111 has a member inclined surface 112, the slider block 122 has a block inclined surface 123, and the block inclined surface 123 contacts the member inclined surface 112 to be moved thereon.

The slot member 111 includes a first end portion 113 and a second end portion 114. When the slider block 122 is at the first end portion 113, the shaft 121 is in the first shaft position P1. When the slider block 122 is at the second end portion 114, the shaft 121 is in the second shaft position P2. The first end portion 113 of the slot member 111 has a first end thickness t1, the second end portion 114 of the slot member 111 has a second end thickness t2, and the second end thickness t2 is greater than the first end thickness t1.

The pivot unit 120 further includes at least one elastic element 124. The elastic element 124 is telescoped on the shaft 121, an end of the elastic element 124 abuts the slider block 122, and the other end of the elastic element 124 abuts a restriction element (screw nut) 125 of an end of the shaft 121. When the slider block 122 is at the second end portion 114, the elastic element 124 applies an elastic force to the slider block 122 pushes the slider block 122 toward the first end portion 113.

Figure 3:
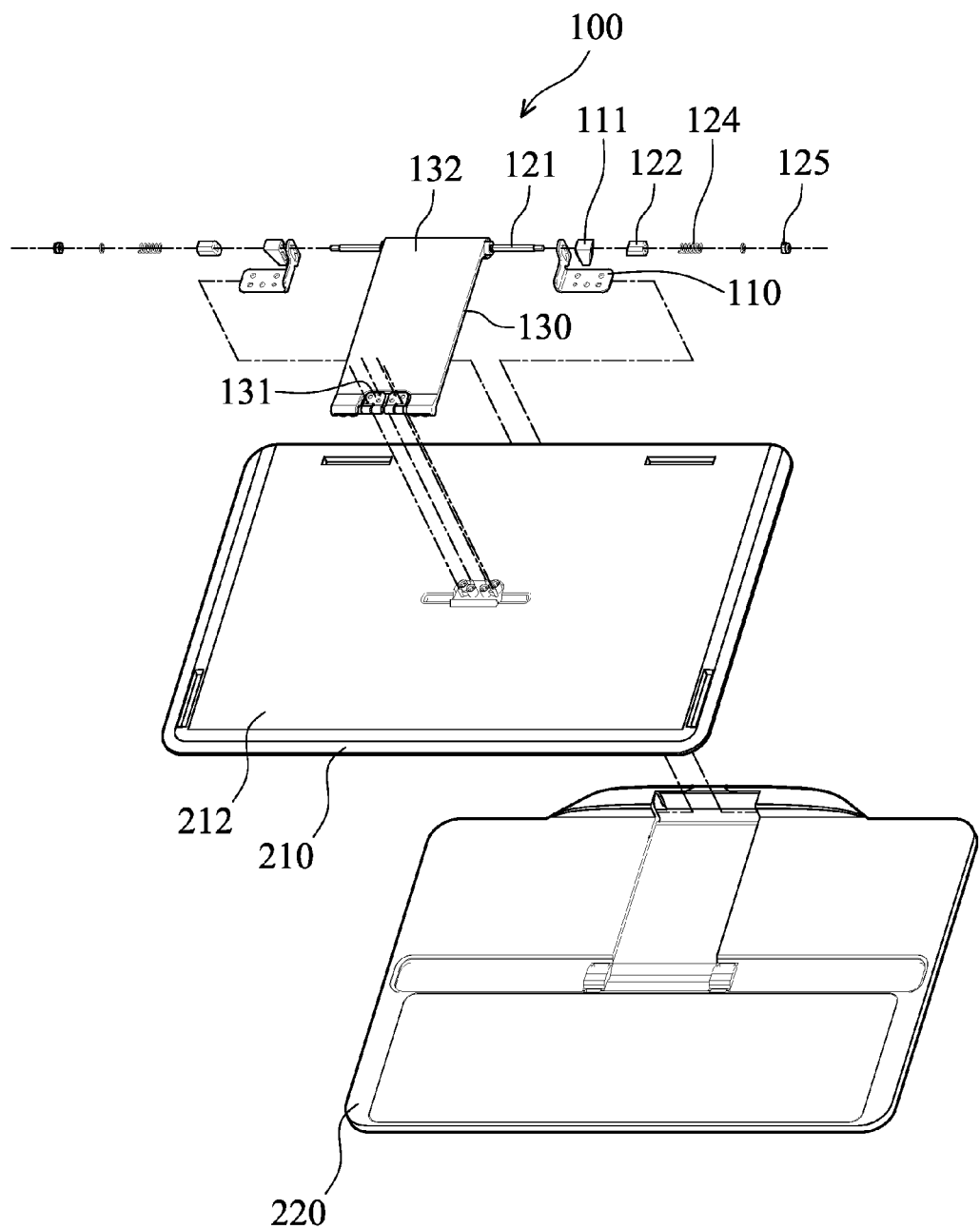
FIG. 3 is an exploded view of the electronic device of the embodiment of the invention.
Figure 4A:
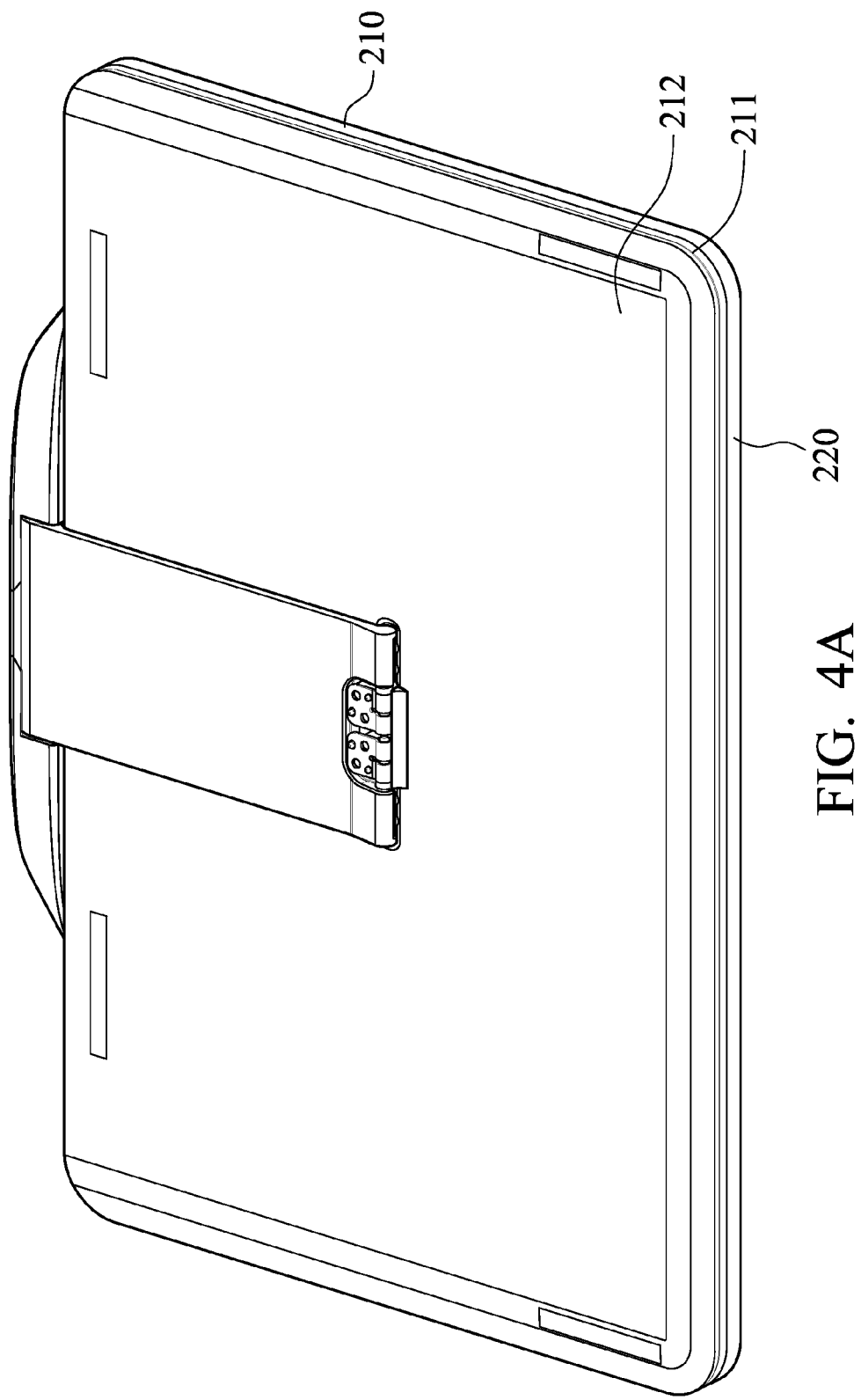
FIG. 4A shows the electronic device of the embodiment of the invention in a closed state.
Figure 4B:
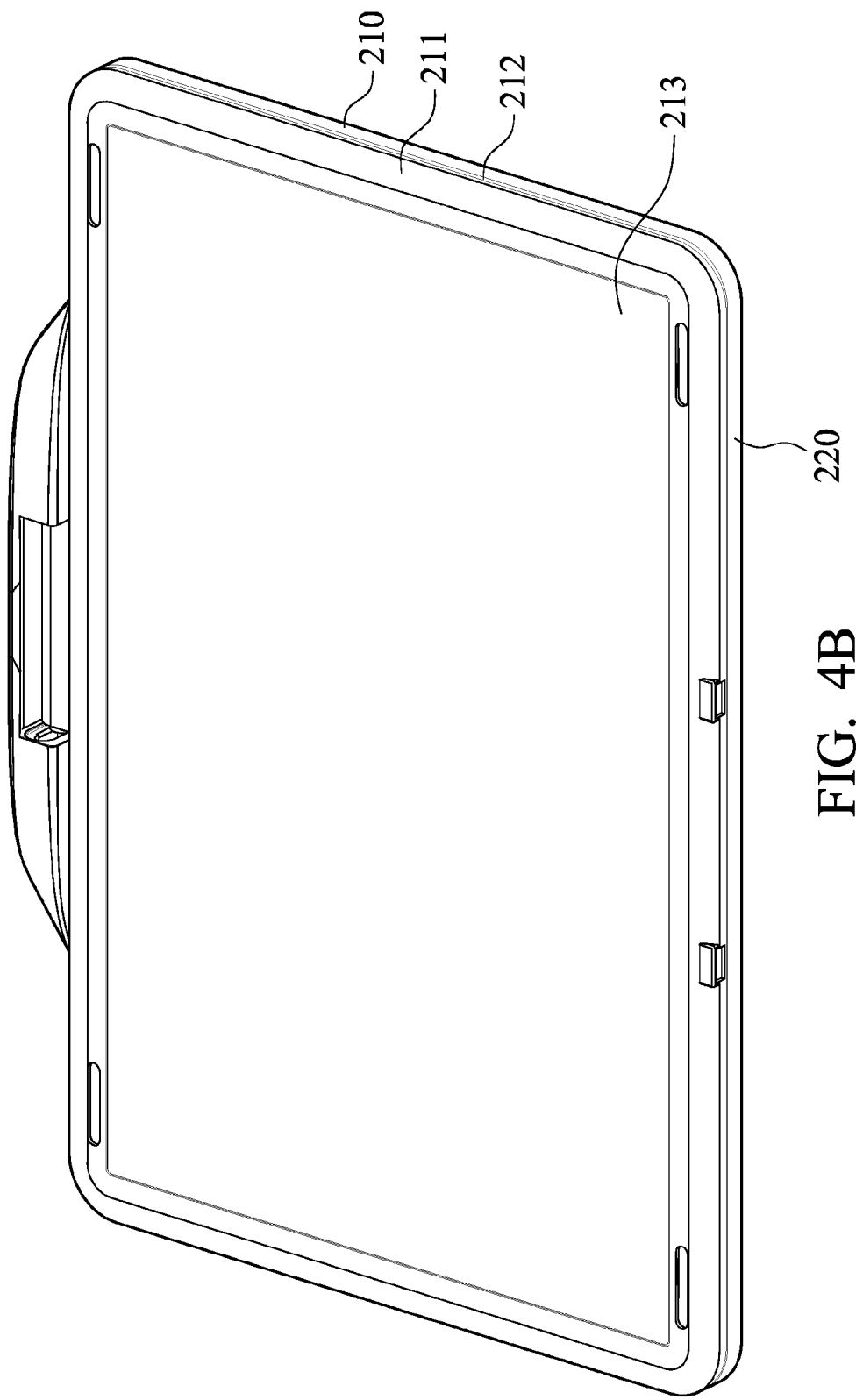
FIG. 4B shows the electronic device of the embodiment of the invention in a folded operation state.

FIG. 3 is an exploded view of an electronic device 200 of an embodiment of the invention utilizing the hinge structure 100 mentioned above. The electronic device 200 includes a first part 210, a second part 220 and the hinge structure 100. In this embodiment, the first part 210 can be a tablet computer or screen. The second part 220 can be a keyboard (operation interface), base or computer host. With reference to FIGS. 4A and 4B, the first part 210 includes a first surface 211, a second surface 212 and an interface unit 213 (FIG. 4B), wherein the first surface 211 is opposite to the second surface 212, and the interface unit 213 is disposed on the first surface 211. The fixing base 110 of the hinge structure 100 is disposed on the second part 220. The shaft 120 of the hinge structure 100 extends into the second part 220. The first connection portion 131 of the supporting element 130 of the hinge structure 100 is connected to the first part 210. The second connection portion 132 is connected to the shaft 121, and the shaft 121 passes through the fixing base 110. The interface unit 213 can be a touch screen or other display devices.

With reference to FIG. 4A, when the electronic device is in a closed state (an included angle between the first surface 211 and the second part 220 is 0 degrees), the first part 210 overlaps with the second part 220, and the first surface 211 faces the second part 220, and, with reference to FIG. 2B, the shaft 121 is moved from the first shaft position P1 to the second shaft position P2.

Utilizing the hinge structure of the embodiment of the invention, the shaft can be moved upwardly and downwardly. When the electronic device is in the closed state, the first surface 211 of the first part 210 can tightly overlap the second part 220. The gap between the first surface 211 of the first part 210 and the second part 220 is reduced, and the total thickness of the electronic device is therefore decreased.

With reference to FIG. 4B, when the electronic device is in a folded operation state (the included angle between the first surface 211 and the second part 220 is 180 degrees), the first part 210 overlaps with the second part 220, and the second surface 212 faces the second part 220. With reference to FIG. 2A, when the electronic device is in the folded operation state, the shaft 121 is in the first shaft position P1.

Figure 5A:
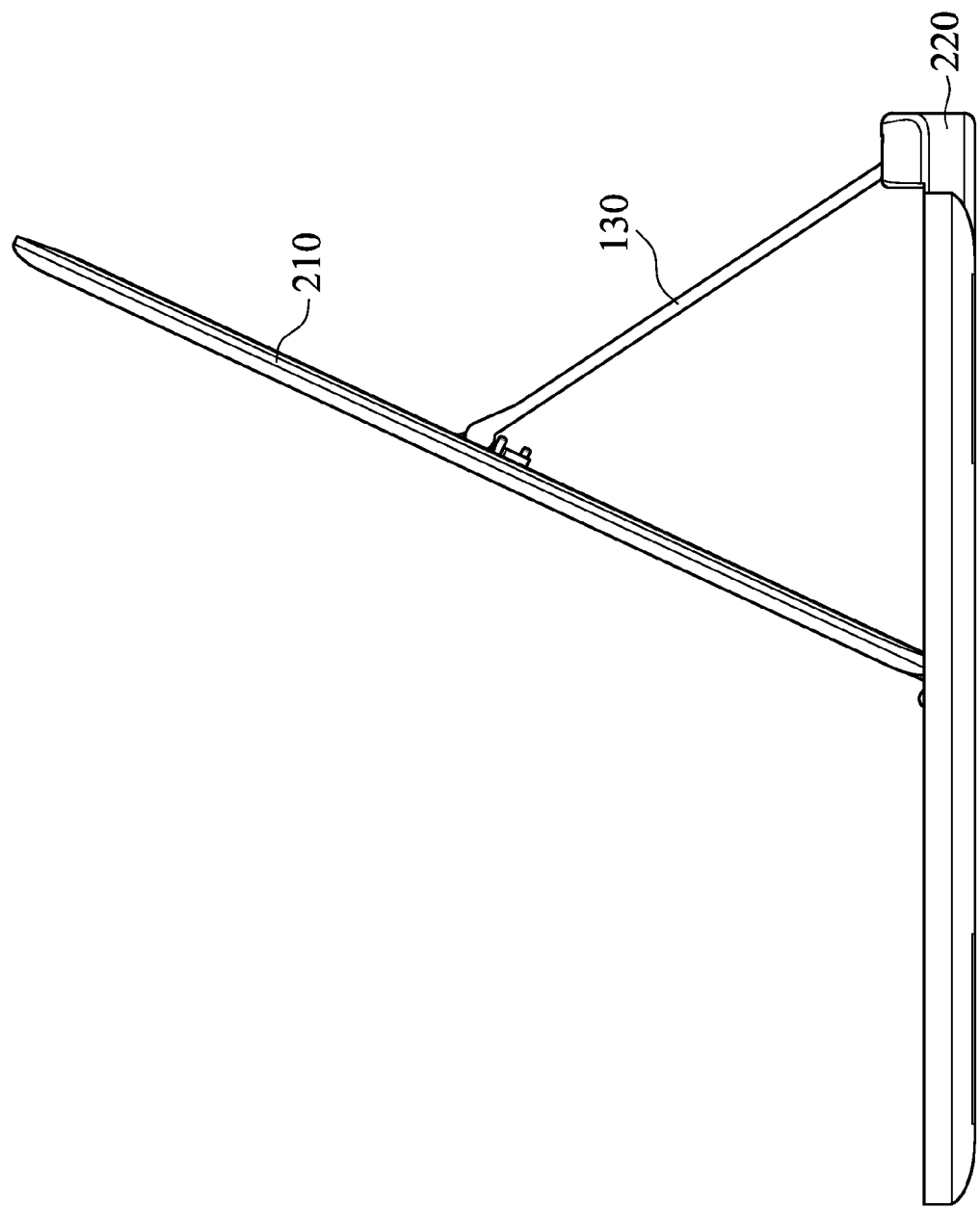
FIGS. 5A and 5B show the electronic device of the embodiment of the invention in a different operation state.
Figure 5B:
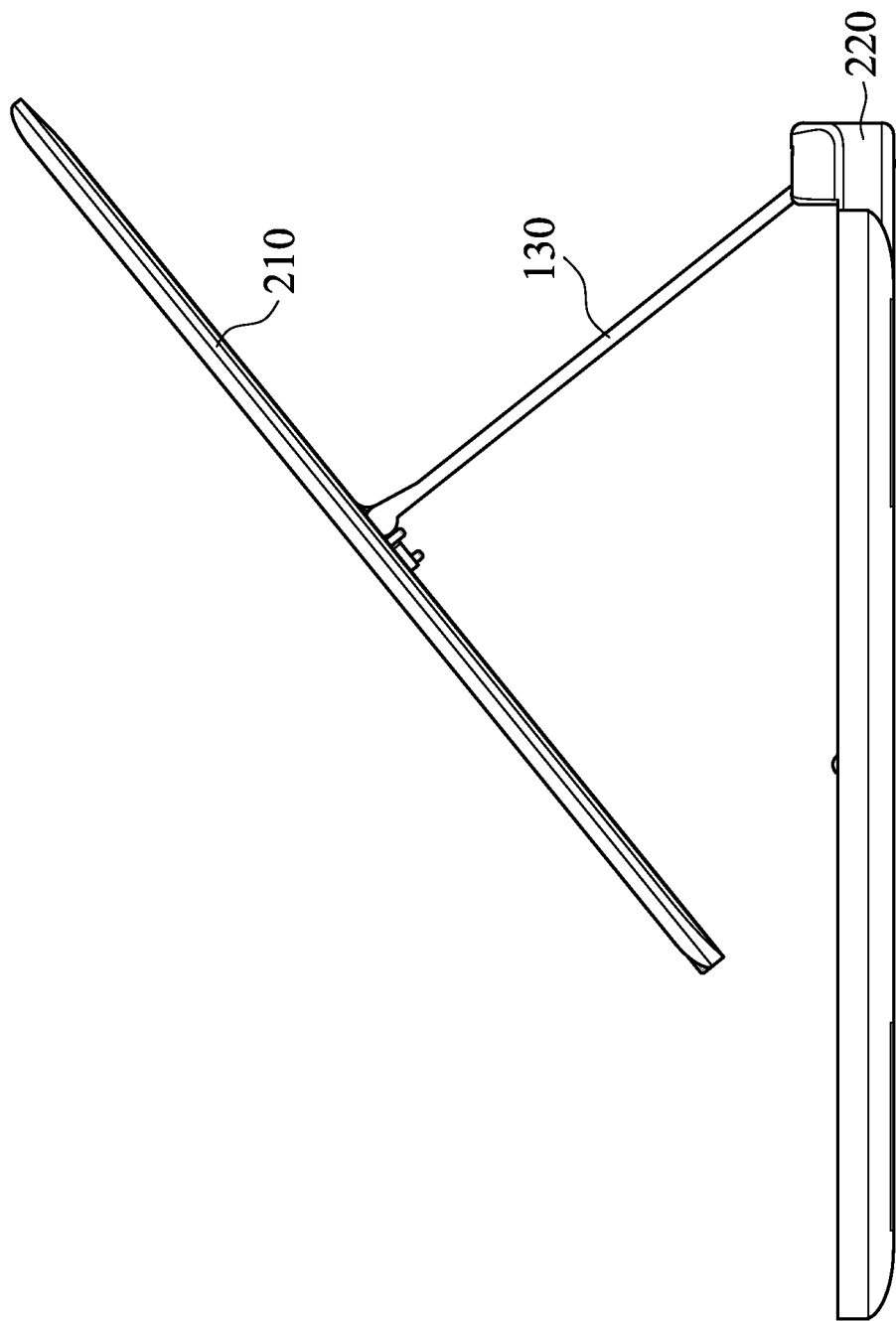
Figure 5C:
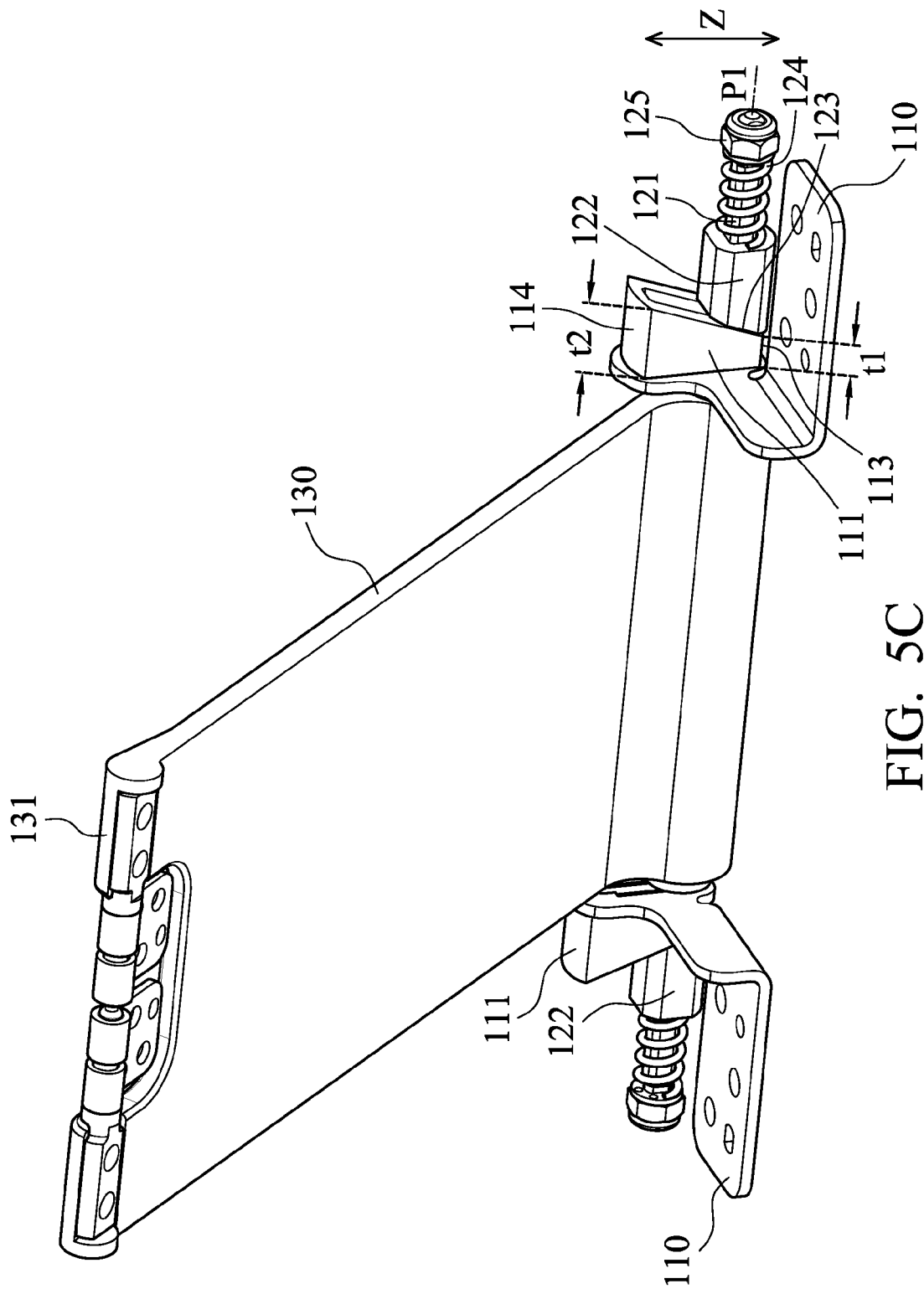
FIG. 5C shows the position of the shaft of the embodiment of the invention when the electronic device is in an operation state.

The ends of the shaft 121 can be tightly fitted with the second part 220, and the supporting element 130 can stay in any orientation relative to the second part 220 with neutral equilibrium. For example, with reference to FIGS. 5A and 5B, in the operation state, the orientation of the first part 210 and the supporting element 130 can be modified as required. With reference to FIG. 5C, in the operation state, the shaft 121 is in the first shaft position P1.

Figure 6:
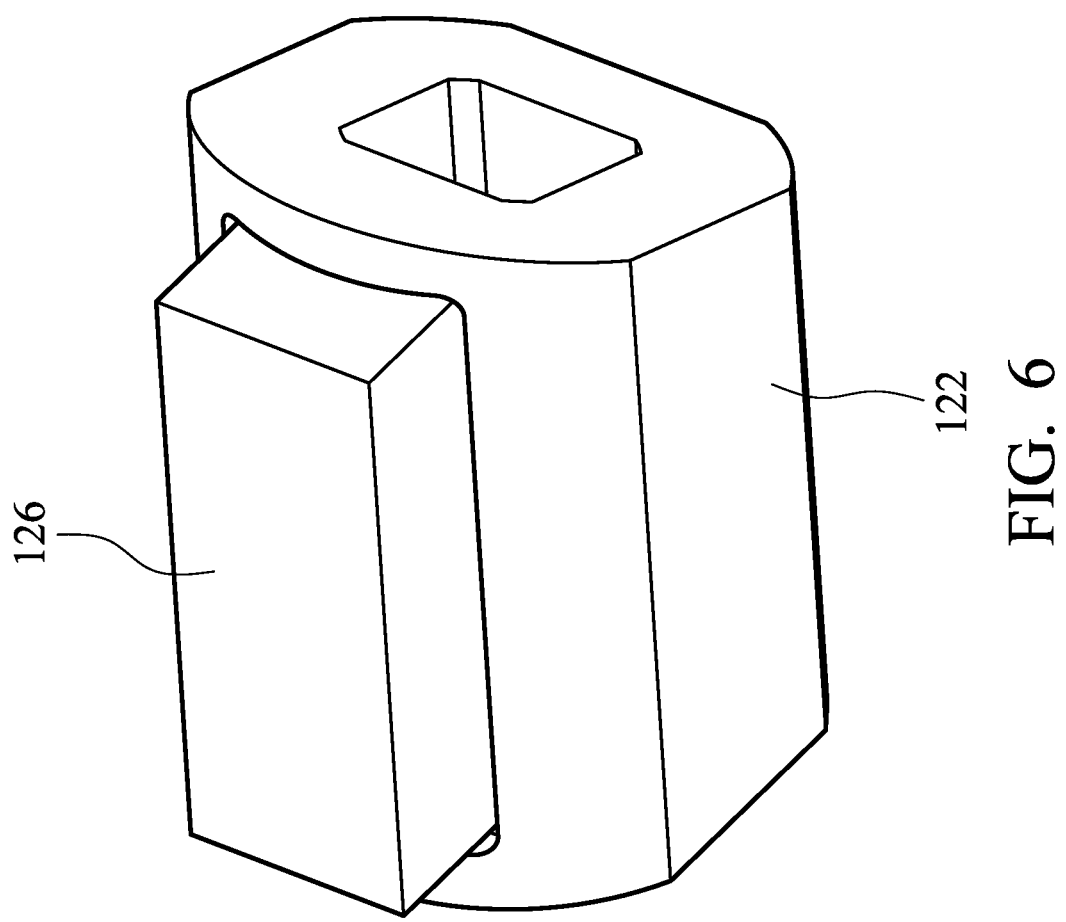
FIG. 6 shows the block magnetic element of the embodiment of the invention attached to a slider block.

In one embodiment of the invention, the slot member 111 includes a member magnetic element disposed on the first end portion 113. The member magnetic element can be attached to a first end portion 113, or be a portion of the first end portion 113. The slider block 122 includes a block magnetic element 126, and the block magnetic element 126 can be attached to a slider block 122 (FIG. 6), or be a portion of the slider block 122. When the slider block 122 is at the second end portion 114, a magnetic force between the block magnetic element 126 and the member magnetic element pushes the slider block 122 toward the first end portion 113. The member magnetic element and the block magnetic element can be utilized with or without the elastic element.

Figure 7:
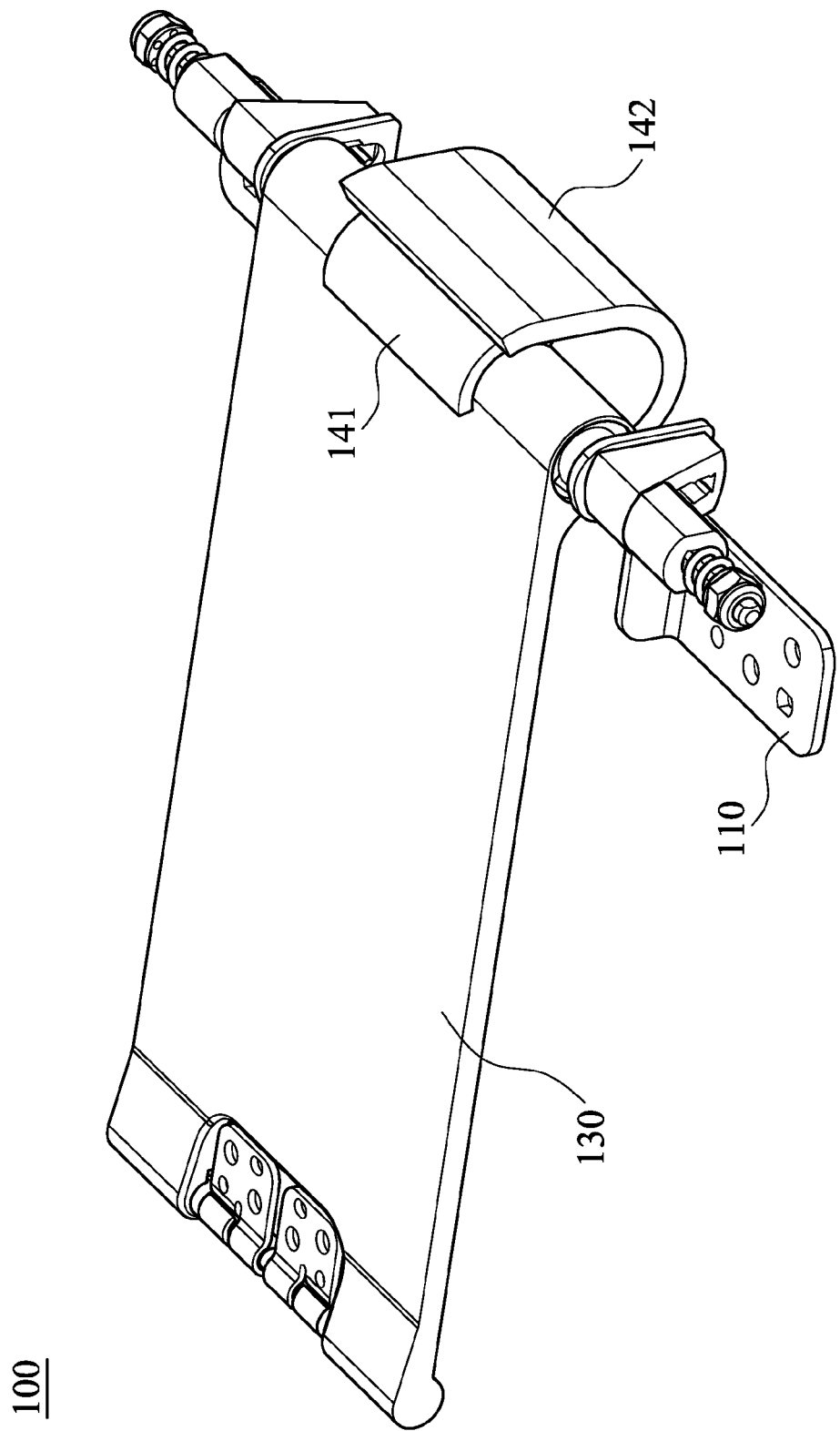
FIG. 7 shows the hinge structure of a modified embodiment of the invention.

With reference to FIG. 7, in one embodiment of the invention, the hinge structure 100 further includes a stabilizing magnet 141 and a stabilizing element 142. The stabilizing magnet 141 is disposed on a surface of the supporting element 130. In this embodiment, the stabilizing magnet 141 is a tile-shaped magnet. The stabilizing element 142 is fixed relative to the fixing base 110 (fixed to the fixing base 110 or fixed to the second part 220), wherein the stabilizing magnet 141 corresponds to the stabilizing element 142, a magnetic force is generated between the stabilizing magnet 141 and the stabilizing element 142 to ensure that the supporting element 130 pivots stably without swinging.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A hinge structure, comprising:
 a fixing base;
 a pivot unit, comprising a shaft, wherein the shaft passes through the fixing base, and the shaft is moved in a predetermined direction between a first shaft position and a second shaft position relative to the fixing base, and the predetermined direction is perpendicular to an extending direction of the shaft; and
 a supporting element, comprising a first connection portion and a second connection portion, wherein the first connection portion and the second connection portion are respectively located at two ends of the supporting element, and the second connection portion is connected to the shaft,
 wherein the fixing base comprises at least one slot member, and the pivot unit comprises at least one slider block, and the slider block is disposed on the shaft, the slot member is fixed to the fixing base, the shaft passes through the slot member, the slot member has a member inclined surface, the slider block has a block inclined surface, and the block inclined surface contacts the member inclined surface to be moved thereon, wherein neither the member inclined surface nor the block inclined surface is parallel to the shaft.

2. The hinge structure as claimed in claim 1, further comprising a stabilizing magnet and a stabilizing element, wherein the stabilizing magnet is disposed on a surface of the supporting element, and the stabilizing element is fixed relative to the fixing base, and the stabilizing magnet corresponds to the stabilizing element, wherein a magnetic force is generated between the stabilizing magnet and the stabilizing element to ensure that the supporting element pivots stably.

3. The hinge structure as claimed in claim 1, wherein the slot member comprises a first end portion and a second end portion, and when the slider block is at the first end portion, the shaft is in the first shaft position, and when the slider block is at the second end portion, the shaft is in the second shaft position.

4. The hinge structure as claimed in claim 3, wherein the pivot unit further comprises at least one elastic element, and the elastic element is telescoped on the shaft, an end of the elastic element abuts the slider block, and the other end of the elastic element abuts an end of the shaft, and when the slider block is at the second end portion, the elastic element applies an elastic force to the slider block.

5. The hinge structure as claimed in claim 3, wherein the slot member comprises a member magnetic element disposed on the first end portion, and the slider block comprises a block magnetic element, and when the slider block is at the second end portion, a magnetic force generated between the block magnetic element and the member magnetic element pushes the slider block toward the first end portion.

6. A hinge structure, comprising:
a fixing base;
a pivot unit, comprising a shaft, wherein the shaft passes through the fixing base, and the shaft is moved in a predetermined direction between a first shaft position and a second shaft position relative to the fixing base, and the predetermined direction is perpendicular to an extending direction of the shaft; and
a supporting element, comprising a first connection portion and a second connection portion, wherein the first connection portion and the second connection portion are respectively located at two ends of the supporting element, and the second connection portion is connected to the shaft,
wherein the fixing base comprises at least one slot member, and the pivot unit comprises at least one slider block, and the slider block is disposed on the shaft, the slot member is fixed to the fixing base, the shaft passes through the slot member, the slot member has a member inclined surface, the slider block has a block inclined surface, and the block inclined surface contacts the member inclined surface to be moved thereon,
wherein the slot member comprises a first end portion and a second end portion, and when the slider block is at the first end portion, the shaft is in the first shaft position, and when the slider block is at the second end portion, the shaft is in the second shaft position,
wherein the first end portion of the slot member has a first end thickness, and the second end portion of the slot member has a second end thickness, and the second end thickness is greater than the first end thickness.

7. The hinge structure as claimed in claim 6, further comprising a stabilizing magnet and a stabilizing element, wherein the stabilizing magnet is disposed on a surface of the supporting element, and the stabilizing element is fixed relative to the fixing base, and the stabilizing magnet corresponds to the stabilizing element, wherein a magnetic force is generated between the stabilizing magnet and the stabilizing element to ensure that the supporting element pivots stably.

8. The hinge structure as claimed in claim 7, wherein the stabilizing magnet is a tile-shaped magnet.

9. An electronic device, comprising:
a first part, comprising a first surface, a second surface and an interface unit, wherein the first surface is opposite to the second surface, and the interface unit is disposed on the first surface;
a second part;
a fixing base, disposed on the second part;
a pivot unit, comprising a shaft, wherein the shaft passes through the fixing base, and the shaft is moved in a predetermined direction between a first shaft position and a second shaft position relative to the fixing base, and the predetermined direction is perpendicular to an extending direction of the shaft; and
a supporting element, comprising a first connection portion and a second connection portion, wherein the first connection portion is connected to the first part, the second connection portion is connected to the shaft.

10. The electronic device as claimed in claim 9, wherein when the electronic device is in a closed state, the first part overlaps with the second part, the first surface faces the second part, and the shaft is moved from the first shaft position to the second shaft position.

11. The electronic device as claimed in claim 10, wherein the fixing base comprises at least one slot member, and the pivot unit comprises at least one slider block, and the slider block is disposed on the shaft, the slot member is fixed to the fixing base, the shaft passes through the slot member, the slot member has a member inclined surface, the slider block has a block inclined surface, and the block inclined surface contacts the member inclined surface to be moved thereon.

12. The electronic device as claimed in claim 11, wherein the slot member comprises a first end portion and a second end portion, and when the slider block is at the first end portion, the shaft is in the first shaft position, and when the slider block is at the second end portion, the shaft is in the second shaft position.

13. The electronic device as claimed in claim 12, wherein the first end portion of the slot member has a first end thickness, and the second end portion of the slot member has a second end thickness, and the second end thickness is greater than the first end thickness.

14. The electronic device as claimed in claim 13, wherein the pivot unit further comprises at least one elastic element, and the elastic element is telescoped on the shaft, an end of the elastic element abuts the slider block, and the other end of the elastic element abuts an end of the shaft, and when the slider block is at the second end portion, the elastic element applies an elastic force to the slider block.

15. The electronic device as claimed in claim 13, wherein the slot member comprises a member magnetic element disposed on the first end portion, and the slider block comprises a block magnetic element, and when the slider block is at the second end portion, a magnetic force generated between the block magnetic element and the member magnetic element pushes the slider block toward the first end portion.

16. The electronic device as claimed in claim 10, further comprising a stabilizing magnet and a stabilizing element, wherein the stabilizing magnet is disposed on a surface of the supporting element, the stabilizing element is fixed relative to the fixing base, and the stabilizing magnet corresponds to the stabilizing element, wherein a magnetic force is generated between the stabilizing magnet and the stabilizing element to ensure that the supporting element pivots stably.

17. The electronic device as claimed in claim 16, wherein the stabilizing magnet is a tile-shaped magnet.

18. The electronic device as claimed in claim 9, wherein the interface unit is a touch screen.

19. The electronic device as claimed in claim 18, wherein the second part comprises an operation interface.

20. The electronic device as claimed in claim 9, wherein when the supporting element is pivoted relative to the second part, the supporting element can stay in any orientation with neutral equilibrium.

* * * * *